(12) United States Patent
Won et al.

(10) Patent No.: US 8,976,310 B2
(45) Date of Patent: Mar. 10, 2015

(54) ARRAY SUBSTRATE FOR FRINGE FIELD SWITCHING MODE LIQUID CRYSTAL DISPLAY DEVICE

(71) Applicant: LG Display Co., Ltd., Seoul (KR)

(72) Inventors: Dae-Hyun Won, Daegu-si (KR); Chang-Yeop Shin, Gumi-si (KR); Ae-Kyung Shin, Daegu-si (KR); Ru-Da Lee, Gochang-gun (KR)

(73) Assignee: LG Display Co., Ltd., Seoul (KR)

( * ) Notice: Subject to any disclaimer, the term of this patent is extended or adjusted under 35 U.S.C. 154(b) by 167 days.

(21) Appl. No.: 13/725,727

(22) Filed: Dec. 21, 2012

(65) Prior Publication Data

US 2013/0229589 A1 Sep. 5, 2013

(30) Foreign Application Priority Data

Mar. 5, 2012 (KR) .................. 10-2012-0022501

(51) Int. Cl.
| | |
|---|---|
| *G02F 1/136* | (2006.01) |
| *G02F 1/13* | (2006.01) |
| *G02F 1/1368* | (2006.01) |
| *H01L 21/66* | (2006.01) |
| *G02F 1/1343* | (2006.01) |
| *G02F 1/1362* | (2006.01) |

(52) U.S. Cl.
CPC ............ *G02F 1/1309* (2013.01); *G02F 1/1368* (2013.01); *G02F 2001/134372* (2013.01); *G02F 2001/136254* (2013.01); *H01L 22/00* (2013.01)
USPC ............................................. 349/43; 257/48

(58) Field of Classification Search
CPC .................. G02F 1/1309; G02F 2001/134372; G02F 2001/136254
USPC ................................................ 349/43; 257/48
See application file for complete search history.

(56) References Cited

U.S. PATENT DOCUMENTS

| | | | |
|---|---|---|---|
| 8,330,691 B2 | 12/2012 | Tanimoto et al. | |
| 2005/0007526 A1* | 1/2005 | Lim | .............................. 349/110 |
| 2013/0155357 A1* | 6/2013 | Ota | ................................ 349/110 |

FOREIGN PATENT DOCUMENTS

| | | |
|---|---|---|
| JP | 10-339887 A | 12/1998 |
| JP | 2008-191669 A | 8/2008 |
| JP | 2009-216963 A | 9/2009 |
| WO | WO 2008/026344 A | 3/2008 |

* cited by examiner

*Primary Examiner* — Michael Caley
(74) *Attorney, Agent, or Firm* — Birch, Stewart, Kolasch & Birch, LLP

(57) ABSTRACT

An array substrate for a fringe field switching mode liquid crystal display, and the display are discussed. According to an embodiment, the array substrate includes a display area including pixel areas defined gate lines and data lines crossing the gate lines, each pixel area including a switching thin film transistor and a plate-shaped pixel electrode connected to the switching thin film transistor, the display area of the display further including a common electrode having openings in correspondence with the pixel electrodes, the common electrode being formed over the pixel electrodes throughout an entire area of the display area; and first through fourth non-display areas surrounding the display area and including pixel areas surrounding the display area, wherein each test pixel area includes a test thin film transistor and a test electrode connected to the corresponding test thin film transistor.

20 Claims, 7 Drawing Sheets

ARRAY SUBSTRATE FOR FRINGE FIELD SWITCHING MODE LIQUID CRYSTAL DISPLAY DEVICE

The present application claims the priority benefit of Korean Patent Application No. 10-2012-0022501 filed in Republic of Korea on Mar. 5, 2012, which is hereby incorporated by reference in its entirety.

BACKGROUND

1. Field of the Disclosure

The present disclosure relates to a Liquid Crystal Display (LCD) device, and more particularly, to an array substrate for a fringe field switching mode liquid crystal display device, which enables measurement of the properties of thin film transistors included in a display area of the display device.

2. Discussion of the Related Art

In general, a liquid crystal display (LCD) device is driven using optical anisotropy and polarization of liquid crystal molecules. Since liquid crystal molecules have a thin, long molecular structure, an arrangement of the liquid crystal molecules has directivity. Thus, when an electric field is applied to the liquid crystals, the molecular arrangement direction of the liquid crystals is changed.

Accordingly, by arbitrarily adjusting the molecular arrangement direction of the liquid crystals, the molecular arrangement of the liquid crystals is changed, and light is refracted in the molecular arrangement direction of the liquid crystals to thereby display image information.

An active matrix LCD (AM-LCD, hereinafter simply referred to as an LCD) in which thin film transistors and pixel electrodes connected to the thin film transistors are arranged in a matrix form has been attracting attention due to its high resolution and excellent quality of fast moving images.

The LCD generally includes a color filter substrate in which a common electrode is formed, an array substrate in which pixel electrodes are formed, and liquid crystals filled between the color filter substrate and the array substrate. The common electrodes and the pixel electrodes drive liquid crystals by an electric field applied in an up-down direction therebetween. The LCD has an excellent light transmission rate and aperture ratio.

However, in the general LCD, liquid crystal driving by an electric field applied in the up-down direction becomes a factor for deteriorating a viewing angle property. In order to overcome this disadvantage, an in-plane switching mode LCD having an excellent viewing angle has been proposed.

Hereinafter, a general in-plane switching mode LCD will be described in detail with reference to FIG. 1.

FIG. 1 is a cross-sectional view of the general in-plane switching mode LCD.

As shown in FIG. 1, an upper substrate 9 which is a color substrate is spaced apart from a lower substrate 10 which is an array substrate, and faces the lower substrate 10. A liquid crystal layer 11 is inserted between the upper and lower substrates 9 and 10.

On the lower substrate 10, a common electrode 17 and a pixel electrode 30 are formed on the same surface, and the liquid crystal layer 11 is driven by a horizontal electric field L formed by the common electrode 17 and the pixel electrode 30.

FIGS. 2A and 2B are views for explaining operations when the in-plane switching mode LCD of FIG. 1 is turned on and off, respectively.

First, referring to FIG. 2A showing an arrangement of liquid crystal molecules when a voltage is applied to the in-plane switching mode LCD, the arrangement of liquid crystal molecules 11a positioned at locations corresponding to or directly above the common electrode 17 and the pixel electrode 30 does not change, whereas liquid crystal molecules 11b positioned between the common electrode 17 and the pixel electrode 30 are arranged by a horizontal electric field L formed by the common electrode 17 and the pixel electrode 30 in the direction of the horizontal electric field L. In other words, the in-plane switching mode LCD can achieve a wide viewing angle since the liquid crystals are moved by the horizontal electric field.

Therefore, images can be viewed even at angles of about 80° to 89° with respect to the front of the in-plane switching mode LCD, without causing image inversions.

Then, referring to FIG. 2B showing an arrangement of liquid crystal molecules when no voltage is applied to the in-plane switching mode LCD so that the in-plane switching mode LCD is turned off, since no horizontal electric field is formed between the common electrode 17 and the pixel electrode 30, the arrangement of the liquid crystal molecules 11 does not change.

The in-plane switching mode LCD, however, has a low transmission rate and aperture ratio although it can provide an improved viewing angle. In order to overcome these disadvantages of the in-plane switching mode LCD, a fringe field switching mode LCD in which liquid crystals are driven by a fringe field has been proposed.

FIG. 3 is a cross-sectional view of an array substrate 41 for a fringe field switching mode LCD according to a related art, cut along a line crossing the center portion of a pixel area of the LCD.

As shown in FIG. 3, the array substrate 41 for the fringe field switching mode LCD includes a plurality of pixel areas P, a gate line (not shown), and a data line 47, wherein the plurality of pixel areas P are defined by intersections of the upper parts and the lower parts with a gate insulating film 45 therebetween. In each pixel area, a thin film transistor Tr connected to the gate line and the data line 47 is formed. Also, in each pixel area on the gate insulating film 45, a plate-shaped pixel electrode 55 is formed to contact the drain electrode 51 of the thin film transistor Tr. The pixel electrode 55 is formed on the same layer as the data line 47, that is, on the gate insulating film 45, and is spaced a predetermined distance from the data line 47 in order to prevent a short with the data line 47.

Also, a protection layer 60 is formed on the data line 47 and the pixel electrode 55 throughout the entire display area, and a common electrode 65 is formed on the entire surface of the protection layer 60. The common electrode 65 has a plurality of bar-shaped openings oa, which are spaced a predetermined distance from each other in correspondence with the individual pixel areas.

The array substrate 41 for the fringe field switching mode LCD, as described above, should be tested to determine if each thin film transistor Tr has any defect and to check the properties of the thin film transistor Tr. However, since the common electrodes 65 are formed throughout the entire display area, it is not possible to check the properties of the thin film transistor Tr included in the pixel areas configuring the display area of the LCD. Further, it is not possible to check whether or not a corresponding gate or data line connected to a plurality of the thin film transistors Tr's is properly functioning or formed.

More specifically, in order to check the properties of the thin film transistor Tr included in each pixel area of the array substrate 41, a gate signal voltage and a data signal voltage need to be supplied to the gate electrode 43 and the source electrode 49, respectively, to drive the thin film transistor Tr, and also a signal voltage or current changing according to a data signal voltage supplied through the drain electrode 51 needs to be output.

However, in the array substrate 41 for the fringe field switching mode LCD according to the related art, as described above, since the drain electrode 51 of the thin film transistor Tr is connected to the pixel electrode 55 and the pixel electrode 55 is covered by the protection layer 60 and the common electrode 65, it is not possible to make a contact with the drain electrode 51 or with the pixel electrode 55 contacting the drain electrode 51 even when the data signal and the gate signal are respectively applied through the data line 47 and the gate line connected to the thin film transistor Tr. As a result, it is not possible to measure outputs from the thin film transistor TR formed in each pixel area P included in the display area of the LCD.

Accordingly, in the case of the array substrate 41 for the fringe field switching mode LCD according to the related art, a test for checking the properties of the thin film transistor Tr is not possible due to the structural configuration of the LCD.

SUMMARY OF THE INVENTION

Accordingly, the present invention is directed to a display device that substantially obviates one or more of the problems due to limitations and disadvantages of the related art.

An object of the present disclosure is to provide an array substrate for a fringe field switching mode liquid crystal display (LCD), which enables measurement of the properties of each thin film transistor included in a display area of the LCD.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages in accordance with the purpose of the present invention, as embodied and broadly described herein, provided is an array substrate for a fringe field switching mode liquid crystal display, in which a display area including a plurality of pixel areas defined by a plurality of gate lines and a plurality of data lines crossing the plurality of gate lines, and first through fourth non-display areas surrounding the display area are defined, each pixel area including a switching thin film transistor and a plate-shaped pixel electrode connected to the switching thin film transistor, and a common electrode having a plurality of bar-shaped openings in correspondence with the pixel electrode is formed over the pixel electrode throughout the entire area of the display area, wherein the first through fourth non-display areas include a plurality of test pixel areas surrounding the display area, and each test pixel area includes a test thin film transistor and a test electrode, wherein the test electrode is connected to the test thin film transistor, formed on the same layer as the common electrode, made of the same material as the common electrode, and spaced apart from the common electrode.

According to an embodiment, the present invention provides an array substrate for a fringe field switching mode liquid crystal display, the array substrate comprising: a display area including a plurality of pixel areas defined by a plurality of gate lines and a plurality of data lines crossing the plurality of gate lines, each pixel area including a switching thin film transistor and a plate-shaped pixel electrode connected to the switching thin film transistor, the display area of the fringe field switching mode liquid crystal display further including a common electrode having a plurality of bar-shaped openings in correspondence with the pixel electrodes, the common electrode being formed over the pixel electrodes throughout an entire area of the display area; and first through fourth non-display areas surrounding the display area, wherein the first through fourth non-display areas include a plurality of test pixel areas surrounding the display area, wherein each test pixel area includes a test thin film transistor and a test electrode connected to the corresponding test thin film transistor, and wherein each test electrode is formed on a same layer as the common electrode, is made of a same material as the common electrode, and is spaced apart from the common electrode.

According to an embodiment, the present invention provides an array substrate for a fringe field switching mode liquid crystal display, the array substrate comprising: a display area including a plurality of pixel areas for displaying images, the pixel areas including a plurality of switch thin film transistors; and at least one non-display area surrounding in part the display area, the at least one non-display area including a row or column of test pixel areas, each of the test pixel areas including a test thin film transistor and a test electrode connected to the test thin film transistor, wherein a testing of the test pixel areas is used to detect a defect in the switch thin film transistors.

According to an embodiment, the present invention provides a fringe field switching mode liquid crystal display, comprising: an array substrate including a display area for displaying images; a color filter substrate including a color filter layer and a black matrix layer; and a liquid crystal layer between the array substrate and the color filter substrate, wherein the array substrate includes: the display area including a plurality of pixel areas for displaying the images, the pixel areas including a plurality of switch thin film transistors; and at least one non-display area surrounding in part the display area, the at least one non-display area including a row or column of test pixel areas, each of the test pixel areas including a test thin film transistor and a test electrode connected to the test thin film transistor, and wherein a testing of the test pixel areas is used to detect a defect in the switch thin film transistors.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
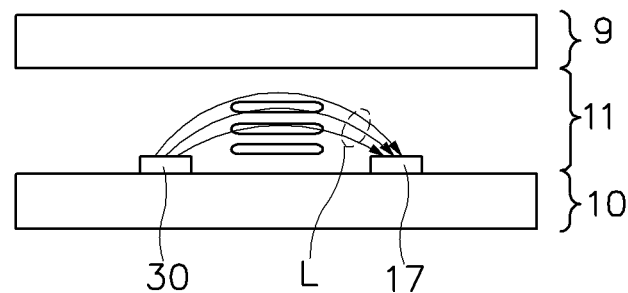
FIG. 1 is a cross-sectional view of a general in-plane switching mode liquid crystal display (LCD)
Figure 2A:
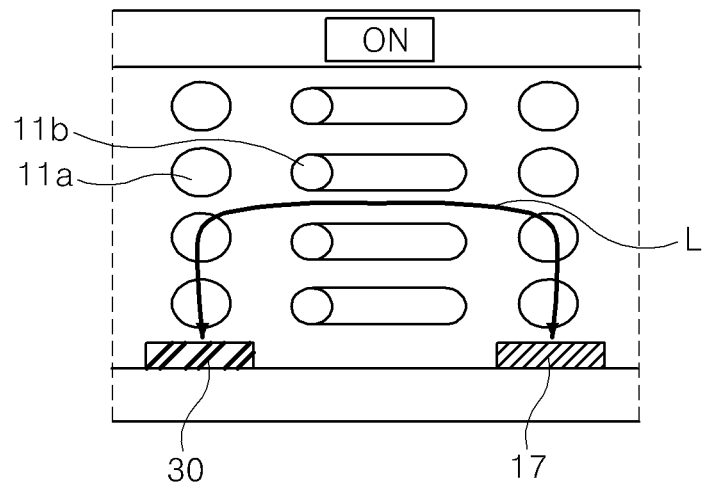
FIGS. 2A and 2B are views for explaining operations when the in-plane switching mode LCD of FIG. 1 is turned on and off, respectively.
Figure 2B:
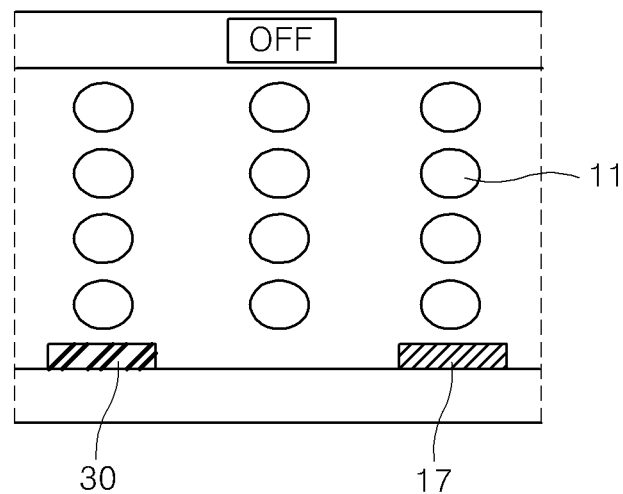
Figure 3:
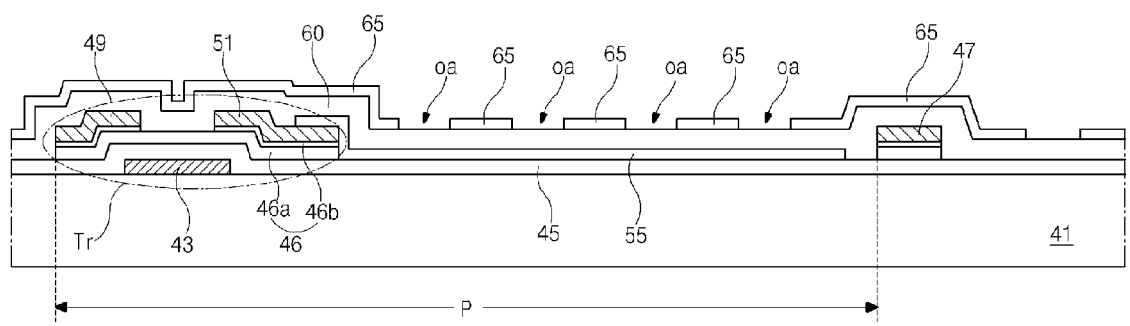
FIG. 3 is a cross-sectional view of an array substrate for a fringe field switching mode LCD according to a related art, cut along a line crossing the center portion of a pixel area of the LCD.
Figure 4:
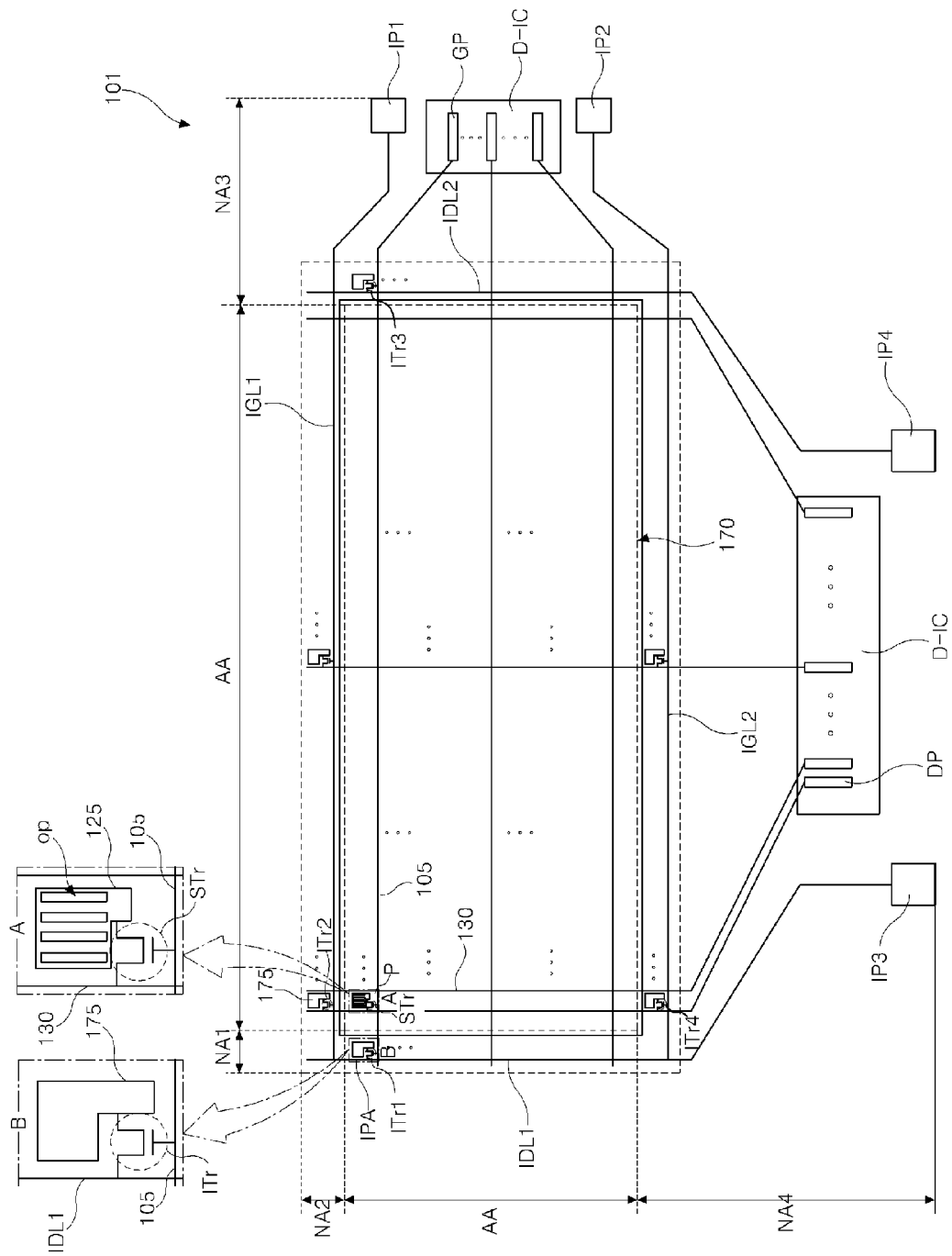
FIG. 4 is a plane view of an array substrate for a fringe field switching mode LCD according to an embodiment of the present invention.
Figure 5:
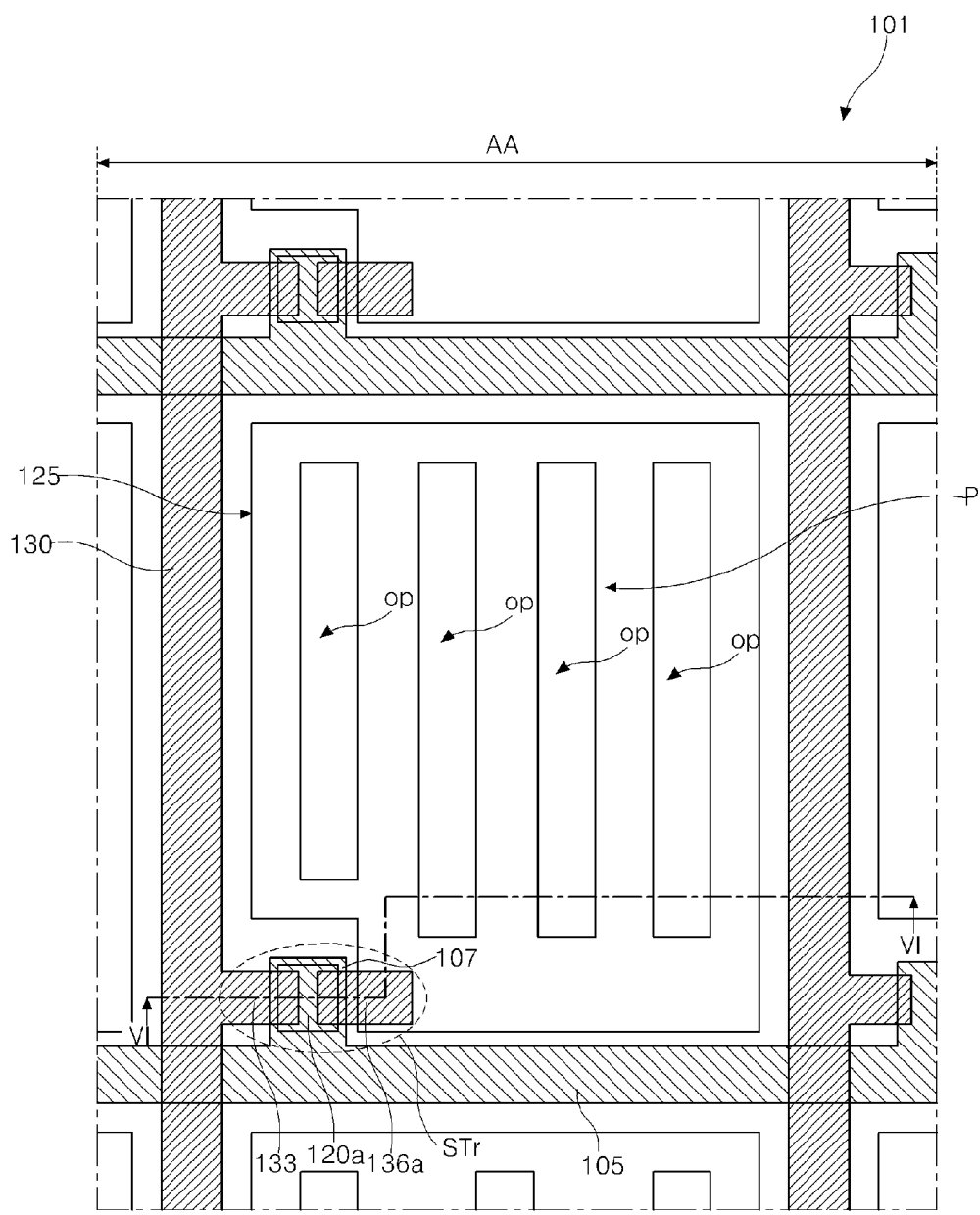
FIG. 5 is an enlarged view of an area A of FIG. 4 according to an embodiment of the present invention.
Figure 6:
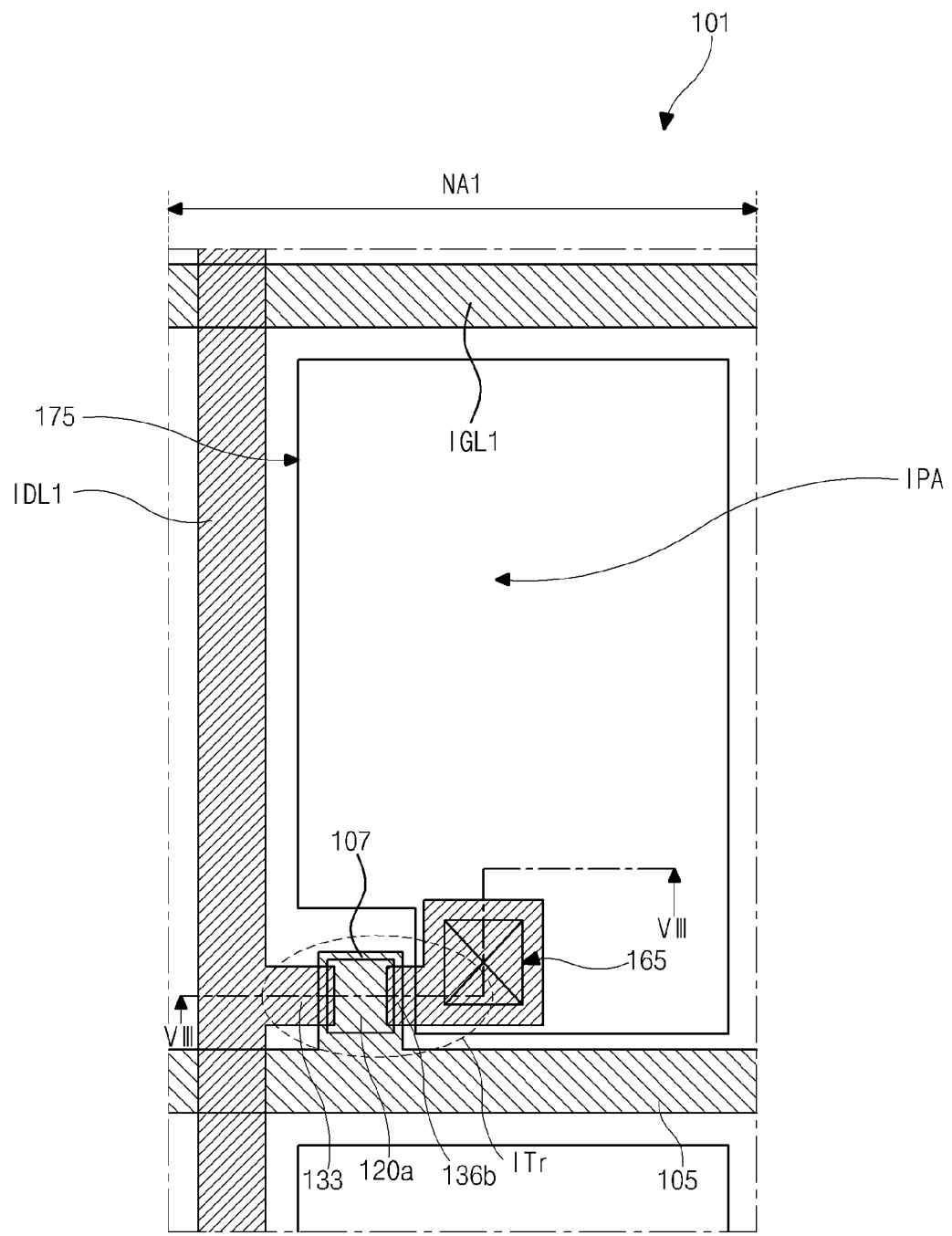
FIG. 6 is an enlarged view of an area B of FIG. 4 according to an embodiment of the present invention.

FIG. 4 is a plane view of an array substrate 101 for a fringe field switching mode LCD according to an embodiment of the present invention. In FIG. 4, a display area AA for displaying images and non-display areas NA1-NA4 surrounding the display area AA are shown together. FIGS. 5 and 6 are enlarged views of an area A and an area B of FIG. 4, respectively. For convenience of description, an area in which a thin film transistor Tr, which is a switching device in each pixel area P, is formed is defined as a switching area TrA, and the non-display areas are defined as first through fourth non-display areas NA1 through NA4, wherein the first and third non-display areas NA1 and NA3 are adjacent to the left and right edges of the display area AA and the second and fourth non-display areas NA2 and NA4 are adjacent to the top and bottom edges of the display area AA of the LCD.

As shown in the drawings, the display area AA of the array substrate 101 for the fringe field switching mode LCD includes a plurality of gate lines 105 and a plurality of data lines 130. The gate lines 105 are spaced apart from each other at certain intervals and extend parallel to each other. The data lines 130 are spaced apart from each other at certain intervals and extend parallel to each other. The gate lines 105 extend in a first direction and are made of a low-resistance metal material, for example, at least one material selected among aluminum (Al), an aluminum alloy such as aluminum-neodymium (AlNd), copper (Cu), a copper alloy, molybdenum (Mo), and molybdenum titanium (MoTi). The data lines 130 are made of a low-resistance material, extend in a second direction generally or substantially perpendicular to the first direction, and cross the gate lines 105 to define a plurality of pixel areas P. instance, the gate and data lines 105 and 130 cross each other perpendicularly to each other to form a matrix configuration in which the pixel areas P are provided.

The gate lines 105 and the data lines 130 extend to the non-display areas NA1 through NA4. One ends of the gate lines 105 are connected to a plurality of gate pad electrodes GP. respectively, and one ends of the data lines 130 are connected to a plurality of data pad electrodes DP, respectively. The gate pad electrodes GP and the data pad electrodes DP are connected to driving circuit ICs (D-ICs).

As part of an advantageous configuration of the array substrate 101 for the fringe field switching mode LCD, the first and third non-display areas NA1 and NA3 include data lines for a test, that is, first and second test data lines IDL1 and IDL2, respectively. The first and second test data lines IDL1 and IDL2 are formed parallel to the data lines 130. Also, the second and fourth non-display areas NA2 and NA4 include gate lines for a test, that is, first and second test gate lines IGL1 and IGL2, respectively. Likewise, the first and second test gate lines IGL1 and IGL2 are formed parallel to the gate lines 105.

The first and second test gate lines IGL1 and IGL2 are connected to first and second test pad electrodes IP1 and IP2, respectively, and the first and second test data lines IDL1 and IDL2 are connected to third and fourth test pad electrodes IP3 and IP4, respectively.

Meanwhile, each pixel area P in the display area AA includes semiconductor layers and a switching thin film transistor STr, wherein the semiconductor layers are connected to a corresponding gate line 105 and a corresponding data line 130. The switching thin film transistor STr includes a gate electrode 107, a gate insulating film, an active layer 120a made of pure amorphous silicon, and an ohmic contact layer made of impure amorphous silicon. The switching thin film transistor STr further includes source and drain electrodes 133 and 136a spaced apart from each other. That is, at each intersection of the gate and data lines 105 and 130, the switching thin film transistor STr is provided such that a plurality of the switching thin film transistors STr are provided in parallel rows and columns in the display area AA.

Also, each pixel area P includes a plate-shaped pixel electrode 125 contacting the drain electrode 136 of the switching thin film transistor STr.

As part of the advantageous configuration of the array substrate 101 for the fringe field switching mode LCD, the non-display areas NA1, NA2, NA3, and NA4 include a plurality of test thin film transistors ITr1, ITr2, ITr3, and ITr4 formed at intersections of the first and second test gate lines IGL1 and IGL2 and the data lines 130 and at intersections of the first and second test data lines IDL1 and IDL2 and the gate lines 105. The test thin film transistors ITr1, ITr2, ITr3, and ITr4 each have the same configuration as the switching thin film transistor STr included in each pixel area P.

Particularly, a plurality of (or a column of) the test thin film transistor ITr1, ITr1, ITr1, . . . are provided at the intersections of the first test data line IDL1 and each of the gate lines 105. Similarly, a plurality of (or a column of) the test thin film transistors ITr3, ITr3, ITr3, . . . are provided at the intersections of the second test data line IDL2 and each of the gate lines 105. Further, a plurality of (or a row of) the test thin film transistors ITr2, ITr2, ITr2, . . . are provided at the intersections of the first test gate line IGL1 and each of the data lines 130. Similarly, a plurality of (or a row of) the test thin film transistors ITr4, ITr4, ITr4, . . . are provided at the intersections of the second test gate line IGL2 and each of the data lines 130. As a result, the gate electrodes of the first and third test thin film transistors ITr1 and ITr3 included in the first and third non-display areas NA1 and NA3 are respectively connected to the plurality of gate lines 105 included in the display area. The source electrodes of the second and fourth test thin film transistors ITr2 and ITr4 included in the second and fourth non-display areas NA2 and NA4 are respectively connected to the plurality of data lines 130 included in the display area.

Accordingly, in the array substrate 101 for the fringe field switching mode LCD according to the present invention, the plurality of test thin film transistors ITr each connected to a gate line 105 and a data line 130 are formed in such a manner to surround the display area AA.

That is, groups of the test thin film transistors ITr are formed at the left side of the leftmost pixel area P of each gate line 105, at the right side of the rightmost pixel area P of each gate line 105, above the top pixel area P of each data line 130, and below the bottom pixel area P of each data line 130, respectively.

All the test thin film transistors included in the first non-display area NA1 (hereinafter referred to as first test thin film transistors ITr1) are connected to the first test data line IDL1 and the third test pad electrode IP3 connected to the first test data line IDL1. All the test thin film transistors included in the second non-display area NA2 (hereinafter referred to as second test thin film transistors ITr2) are connected to the first test gate line IGL1 and the first test pad electrode IP1 connected to the first test gate line IGL1. All the test thin film transistors included in the third non-display area NA3 (hereinafter referred to as third test thin film transistors ITr3) are connected to the second test data line IDL2 and the fourth test pad electrode IP4 connected to the second test data line IDL2. All the test thin film transistors included in the fourth non-display area NA4 (hereinafter referred to as fourth test thin film transistors ITr4) are connected to the second test gate line IGL2 and the second test pad electrode IP2 connected to the second test gate line IGL2.

Meanwhile, in each pixel area P of the display area AA, a plate-shaped transparent common electrode 170, which has a plurality of bar-shaped openings op in correspondence with the pixel electrode 125, faces the pixel electrode 125 with a protection layer interposed between the pixel electrode 125 and the common electrode 170. The protection layer can be made of an insulating material.

The common electrode 170 is formed in correspondence with the pixel areas P of the display area AA, and no common electrode is formed in the non-display areas NA1 through NA4 including the test thin film transistors ITr1 through ITr4.

In the non-display areas NA1 through NA4 as shown in FIG. 6, test electrodes 175 are formed on the protection layer in correspondence with the test thin film transistors ITr1 through ITr4, and respectively connected to the drain electrodes 136b of the test thin film transistors ITr1 through ITr4. The test electrodes 175 are made of the same material as the transparent common electrode 170 and each test electrode 175 preferably has the same shape as the pixel electrode 125 included in each pixel area P.

Referring to FIG. 6, each test pixel area IPA having a test electrode 175 may have the same size and dimensions as each pixel area P included in the display area AA, and the distance between two immediately neighboring test pixel areas IPA can be the same as the distance between two immediately neighboring pixel areas p in the display area AA. Also, in the first and third non-display areas NA1 and NA3, the distance between two immediately neighboring test pixel areas IPA (disposed in a column shape) may be the same as the distance between two immediately neighboring gate lines 105. Similarly, in the second and fourth display areas NA2 and NA4, the distance between two immediately neighboring test pixel areas IPA (disposed in a row shape) may be the same as the distance between two immediately neighboring data lines 130. As a variation, a width in a gate line direction of each test pixel area included in the first and third non-display areas can be equal to or narrower than a width in the same gate line direction of each pixel area included in the display area. Further, a width in a data line direction of the test pixel area included in the second and fourth non-display areas can be equal to or narrower than the width in the same data line direction of the pixel area included in the display area. In an example, a width of a space between one test pixel area and an adjacent pixel area in a specific direction can be equal to or narrower than a width of a space between two adjacent pixel areas in the same specific direction. On the other hand, a width of a space between one test pixel area and an adjacent pixel area in another direction which is perpendicular to that specific direction can be equal to or narrower than a width of a space between two adjacent pixel areas in the same another direction.

Meanwhile, the protective layer 160 is formed between the drain electrodes 136b of the test thin film transistors ITr1 through ITr4 and the test electrodes 175, and the drain electrode 136b of each of the test thin film transistors ITr1 through ITr4 contacts the corresponding test electrode 175 through its drain contact hole 165 exposing the corresponding drain electrode 136b.

Accordingly, due to the above-described configuration of the array substrate 101 for the fringe field switching mode LCD, all of the first test thin film transistors ITr1 included in the first non-display area NA1 are turned on by a data signal voltage supplied through the third test pad electrode IP3 and a gate signal voltage supplied through each of the gate lines 105. By contacting a probe pin to the test electrode 175 connected to the first test thin film transistor ITr1, the properties of the first test thin film transistor ITr1 and thus its test pixel area can be output and checked. Checking one test electrode 175 of the first test thin film transistor ITr1 as discussed above indicates whether or not the corresponding gate line is properly formed/functioning.

Also, all of the second test thin film transistors ITr2 included in the second non-display area NA2 are turned on by a gate signal voltage supplied through the first test pad electrode IP1 and a data signal voltage supplied through each of the data lines 130. By contacting a probe pin to a test electrode 175 connected to a second test thin film transistor ITr2, the properties of the second test thin film transistor ITr2 and thus its test pixel area can be output and checked. Checking one test electrode 175 of the second test thin film transistor ITr2 as discussed above indicates whether or not the corresponding data line is properly formed/functioning.

Likewise, all of the third and fourth test thin film transistors ITr3 and ITr4 included in the third and fourth non-display areas NA3 and NA4, respectively, are turned on by signal voltages supplied through the fourth test pad electrode IP4 and each of the gate lines 105, and through the second test pad electrode IP2 and each of the data lines 130, respectively. By contacting a probe pin to the test electrode 175 connected to the third or fourth test thin film transistor ITr3 or ITr4, the properties of the third or fourth test thin film transistor ITr3 or ITr4 and thus its test pixel area can be output and checked. Checking one test electrode 175 of the third or fourth test thin film transistor ITr3 or ITr4 as discussed above indicates whether or not the corresponding gate line or data line is properly formed/functioning.

Therefore, in the array substrate 101 for the fringe field switching mode LCD, it is possible to determine if a row or column of switching thin film transistors STrs included in the display area AA has any defect and measure the properties of the switching thin film transistors STrs when the common electrode 170 has been completely formed.

Furthermore, in the array substrate 101 for the fringe field switching mode LCD, since a plurality of test pixel areas that are used to measure and output the properties of the thin film transistors are formed adjacent to the beginning and end pixels of horizontal and vertical pixel lines connected to the gate lines 105 and the data lines 130, it is possible to check differences and distribution in pixels' output properties of the upper, lower, left, and right portions of the display area AA. Also, the results of this checking can be reflected and applied to the manufacturing process of other LCDs, which contributes to the quality improvement of the array substrate 101.

Figure 10:
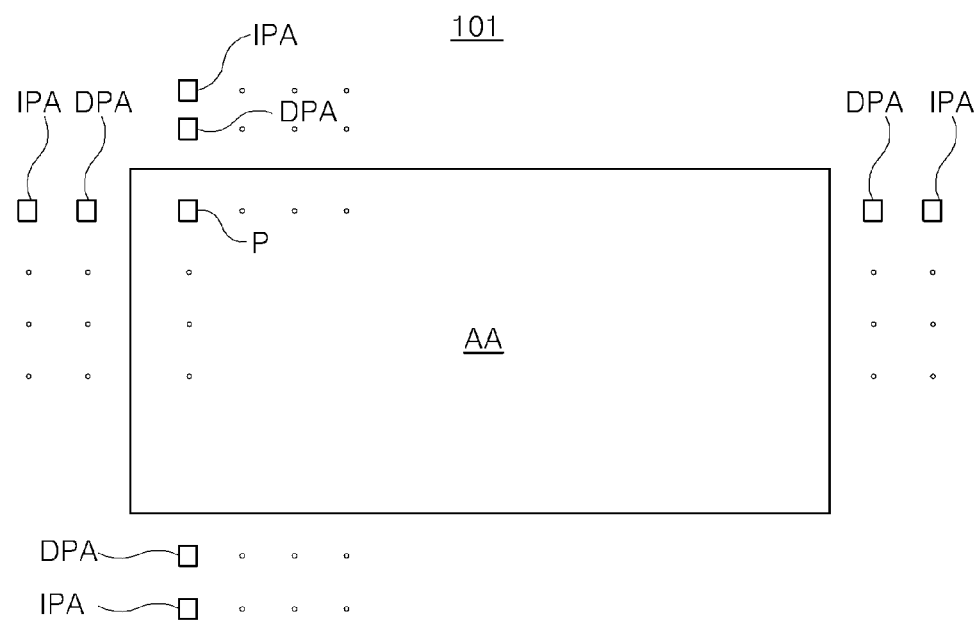
FIG. 10 is a schematic view of the array substrate of the fringe field switching mode LCD including dummy pixel areas according to the embodiment of the present invention.

According to a modified embodiment of the present invention, referring to FIG. 10, a plurality of dummy pixel areas DPA having the same components as the pixel areas P may be formed between the test pixel areas IPA and the display area AA to surround the display area AA. For instance, a dummy pixel area DPA having a certain width may be provided between each of the test pixel areas IPA and the display area AA. Such dummy pixel areas DPA may include no common electrode, or only a part of the dummy pixel areas DPA may include the common electrode 170.

One reason for forming the dummy pixel areas DPA between the test pixel areas IPA and the pixel areas P is to prevent a short between the common electrode 170 and the test electrodes 175 both formed on the same layer (e.g., the protective layer 160), through the dummy pixel areas DPA. That is, by including dummy pixel areas DPA having a width greater than a predetermined fabrication tolerance range of a dummy pixel area DPA (if provided), it is possible to prevent the test electrodes 175 from contacting the common electrode 170, thereby avoiding an electric short between the test electrodes 175 and the common electrode 170 and avoiding a fabrication error. For instance, the dummy pixel area DPA can have a width of one pixel area of the display area.

Hereinafter, a cross-sectional structure of the array substrate 101 for the fringe field switching mode LCD according to an embodiment will be described.

Figure 7:
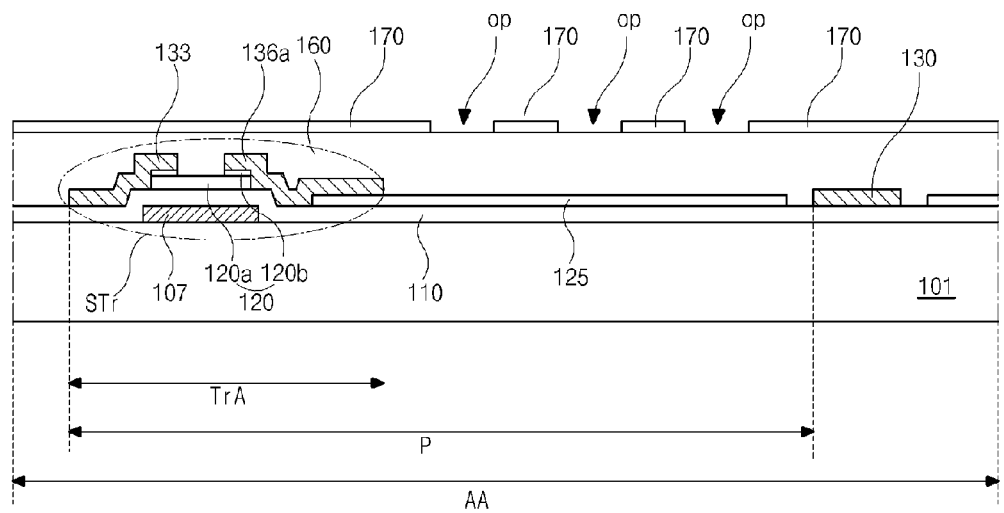
FIG. 7 is a cross-sectional view of a pixel area in a display area in the array substrate for the fringe field switching mode LCD shown in FIG. 4, cut along a line VI-VI of FIG. 5.
Figure 8:
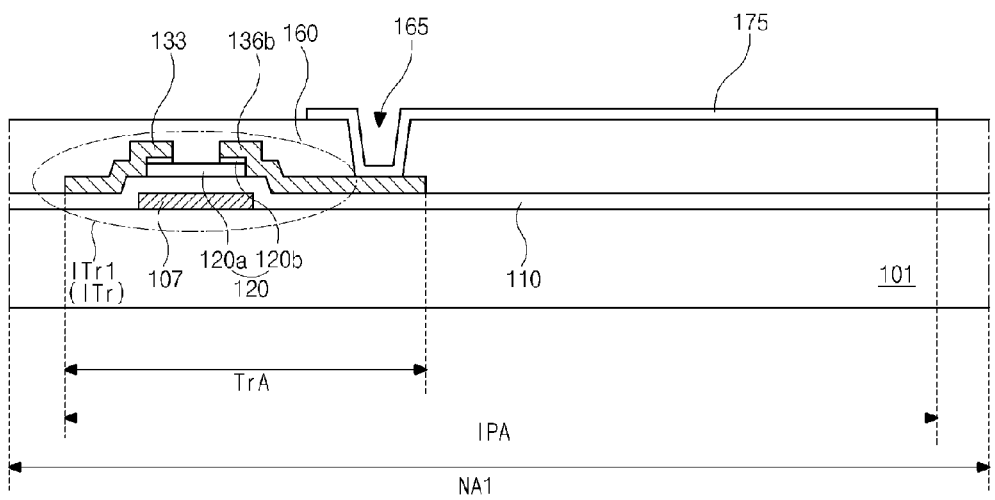
FIG. 8 is a cross-sectional view of a pixel area for a test in the array substrate for the fringe field switching mode LCD shown in FIG. 4, cut along a line VIII-VIII of FIG. 6.

FIG. 7 is a cross-sectional view of a pixel area in the display area AA in the array substrate 101 for the fringe field switching mode LCD shown in FIG. 4, cut along a line VI-VI of FIG. 5, and FIG. 8 is a cross-sectional view of a pixel area for a test in the array substrate 101 for the fringe field switching mode LCD shown in FIG. 4, cut along a line VIII-VIII of FIG. 6. For convenience of description, areas in which the switching thin film transistors STr and the test thin film transistors ITr are formed in the pixel areas P and the test pixel areas IPA, respectively, are referred to as switching areas TrA. Since each test thin film transistor ITr included in the switching areas TrA of the test pixel areas IPA has substantially the same components as each switching thin film transistor STr included in the switching areas TrA of the pixel areas P, the components of the switching thin film transistor STr and the test thin film transistor ITr are allocated the same reference numbers except for their drain electrodes. The drain electrode of the switching thin film transistor STr is denoted by 136a, and the drain electrode of the test thin film transistor ITr is denoted by 136b.

As shown in the drawings, the gate electrode 107 is formed in each switching area TrA on the transparent insulating substrate 101. The gate lines (105 of FIG. 4) in the pixel areas P and the gate electrodes 107 included in the first and third test pixel areas IPA are formed respectively in the display area AA and the first and third non-display areas (NA1 and NA3 of FIG. 4). The first and second test gate lines (IGL1 and IGL2 of FIG. 4) connected to the gate electrodes 107 included in the second and fourth test pixel areas IPA are formed in the second and fourth non-display areas (NA2 and NA4 of FIG. 4)

In an example, the gate lines (105 of FIG. 4), the first and second test gate lines (IGL1 test IGL2 of FIG. 4), and the gate electrodes 107 have a single layer structure made of a metal material having a low resistance, for example, a metal material selected from among aluminum (Al), an aluminum alloy such as aluminum-neodymium (AlNd), copper (Cu), a copper alloy, molybdenum (Mo), and molybdenum titanium (MoTi), or have a multi-layer structure made of two or more materials selected from among the above-mentioned materials. In the drawings, an example of a single layer structure is shown for the sake of brevity.

Then, the gate insulating film 110 made of a nonorganic insulating material, e.g., silicon oxide ($SiO_2$) or silicon nitride ($SiN_x$) is formed on the gate lines (105 of FIG. 4), the first and second test gate lines (IGL1 and IGL2 of FIG. 4), and the gate electrodes 107 throughout the entire area of the substrate 101.

Also, the plate-shaped pixel electrodes 125 are formed in correspondence with the pixel areas P (in correspondence with the pixel areas P and the dummy pixel areas (DPA of FIG. 10) in the case of the modified embodiment) included in the display area AA, on the gate insulating film 110. The test pixel areas IPA include no pixel electrode 125 since they include the test electrodes 175.

Then, in each switching area TrA on the gate insulating film 110, semiconductor layers 120 composed of an active layer 120a made of pure amorphous silicon and ohmic contact layers 120b made of impure amorphous silicon are formed in correspondence with each gate electrode 107. The ohmic contact layers 120b are formed on the active layer 120a and spaced apart from each other to expose the center part of the active layer 120a.

Also, in the switching area TrA, a source electrode 133 and either a drain electrode 136a or 136b are formed on the semiconductor layers 120, specifically, on the ohmic contact layers 120b spaced apart from each other, in a manner to expose the center part of the active layer 120a. In each pixel area P included in the display area AA and in each dummy pixel area of the modified example discussed above, the drain electrode 136a is formed in the corresponding switching area TrA and extends to contact the pixel electrodes 125 included in the pixel area P and the dummy pixel area.

Since no pixel electrode 125 is formed in any of the test pixel areas IPA included in the non-display areas NA1 through NA4 and since the drain electrodes 136b are provided in the test pixel areas IPA, the drain electrodes 136b of the test pixel areas IPA contact no pixel electrode 125. In the case of the drain electrode 136b included in each test pixel area IPA, a drain contact hole 165 is formed in or through the protection layer 160 covering the drain electrode 136, and the drain electrode 136b has a larger area than the drain electrode 136a included in each pixel electrode P so that the drain electrode 136b extends near the center part of the test pixel area IPA. That is, since the test pixel area IPA does not need to form images, the wide area of the drain electrode 136b does not influence an aperture ratio, etc. As shown in FIG. 8, the drain contact hole 165 for each of the test thin film transistors is formed through the protective layer 160 covering the drain electrode 136b, and exposes a portion of the drain electrode 136b. The test electrode 175 formed directly on the protective layer 160 is in contact with the drain electrode 136b through the drain contact hole 165.

Also, in the display area AA and the second and fourth non-display areas (NA2 and NA4 of FIG. 4) on the gate insulating film 110, the data lines 130 connected to the source electrodes 133 included in the pixel areas P and the second and fourth test pixel areas IPA are formed. In the first and third non-display areas (NA1 and NA3 of FIG. 4), the first and second test data lines IDL1 and IDL2 connected to the source electrodes 133 included in the first and second test pixel areas IPA are formed.

Meanwhile, in each switching area TrA, the gate electrode 107, the gate insulating film 110, the semiconductor layers 120, the source electrode 133, and the drain electrode 136a or 136b spaced apart from the source electrode 133, which have been sequentially or otherwise applied, form the thin film transistors STr and ITr.

Then, the protection layer 160 is formed on the thin film transistors STr and ITr and the pixel electrodes 125, in correspondence with the entire display area AA and the test pixel areas IPA of the non-display areas (NA1 through NA4 of FIG. 4). The protection layer 160 is made of a nonorganic insulating material, for example, silicon oxide ($SiO_2$) or silicon nitride ($SiN_x$), or an organic insulating material, for example, benzocyclobutene (BCB) or photo acryl. The protection layer 160 may be formed as a double layer structure made of a nonorganic insulating material and an organic insulating material.

In the drawings, an example in which the protection layer 160 has a single layer structure made of an organic insulating material to form a flat surface is shown for the sake of brevity.

As part of the advantageous configuration of the array substrate 101 for the fringe field switching mode LCD according to the present invention, the drain contact hole 165 is formed in the protection layer 160, in correspondence with each test pixel area IPA, to expose the drain electrode 136b of the test thin film transistor ITr.

Then, the transparent common electrode 170 is formed in a plate form on the protection layer 160, in correspondence with the entire area of the display area AA. The common electrode 170 can be made of a transparent conductive material, for example, indium-tin-oxide (ITO) or indium-zinc-oxide (IZO). The common electrode 170 has a plurality of bar-shaped openings op in correspondence with each pixel area P included in the display area AA, and more specifically, in correspondence with each pixel electrode 125.

Also, in the non-display areas (NA1 through NA4 of FIG. 4) surrounding the display area AA, the test electrode 175 is formed on the protection layer 160 in correspondence with each test pixel area IPA. The test electrodes 175 are preferably made of the same material as the common electrode 170, and are spaced apart from the common electrode 170. Each test electrode 175 contacts the drain electrode 136b of the corresponding test thin film transistor ITr through the drain contact hole 165 formed above the drain electrode 136b. The test electrode 175 of each test pixel area IPA is electrically isolated from the test electrodes 175 of other test pixel areas IPA.

As described above, by forming the test electrodes 175 connected to the test thin film transistors ITr at the edge parts of the array substrate 101 for the fringe field switching mode LCD and applying signal voltages to the thin film transistors ITr through the test electrodes 175, signals including the properties of the thin film transistors ITr can be output and checked, thereby testing the thin film transistors ITr. The testing of all the test electrodes 175 can be performed simultaneously, selectively, independently, sequentially, in groups, or in any other manner.

Also, by forming the plurality of test pixel areas IPA that surround the display area AA, adjacent to the beginning and end parts of each of the horizontal and vertical pixel lines, it is possible to check the property distribution of the display area AA. The results of these checkings can be reflected back to the LCD manufacturing process, which then contributes to the quality improvement of the array substrate 101 according to the present invention.

Figure 9:
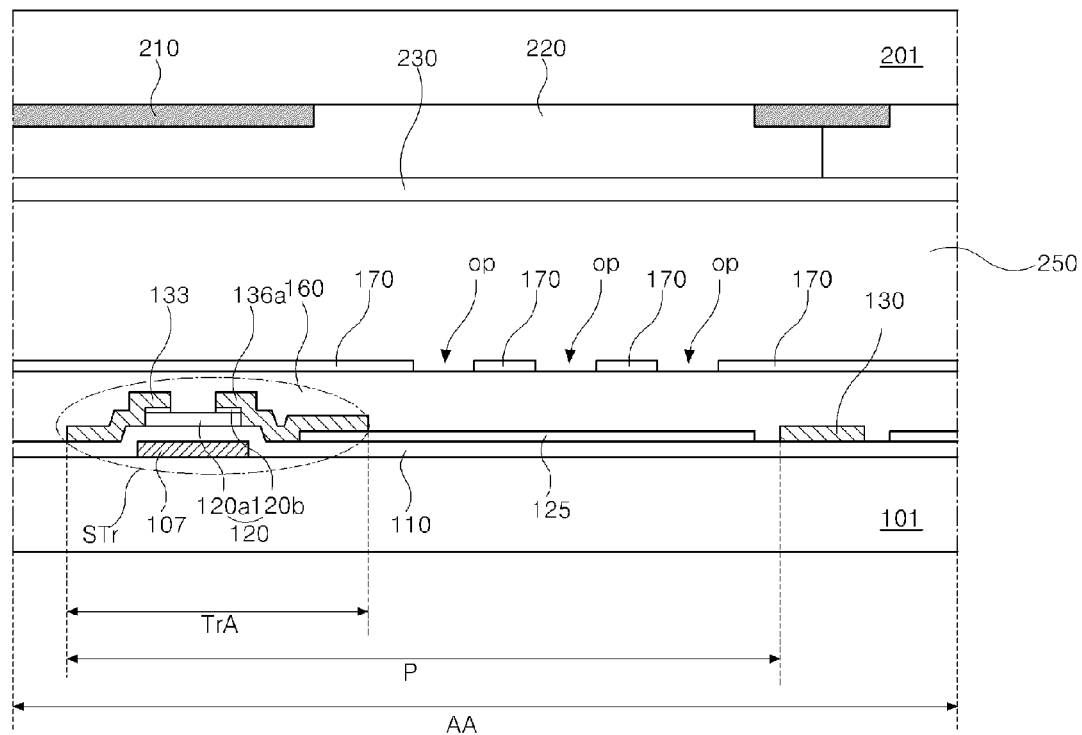
FIG. 9 is a cross-sectional view of the fringe field switching mode LCD according to the embodiment of the present invention.

The array substrate as above is attached to an opposing substrate, for example, a color filter substrate with a liquid crystal layer therebetween, so that the fringe field switching mode LCD can be manufactured. Referring to FIG. 9, a color filter substrate 201 is located over the array substrate 101 with a liquid crystal layer 250 therebetween. A black matrix layer 210 is formed on an inner surface of the color filter substrate 201 and along a peripheral portion of a pixel region P. A color filter layer is formed corresponding to the pixel area P. A planarization layer 230 may be formed on the black matrix layer 210 and the color filter layer 220.

It will be apparent to those skilled in the art that various modifications and variations can be made in a display device of the present disclosure without departing from the sprit or scope of the invention. Thus, it is intended that the present invention covers the modifications and variations of this invention provided they come within the scope of the appended claims and their equivalents.

What is claimed is:

1. An array substrate for a fringe field switching mode liquid crystal display, the array substrate comprising:
    a display area including a plurality of pixel areas defined by a plurality of gate lines and a plurality of data lines crossing the plurality of gate lines, each pixel area including a switching thin film transistor and a plate-shaped pixel electrode connected to the switching thin film transistor,
    the display area of the fringe field switching mode liquid crystal display further including a common electrode having a plurality of bar-shaped openings in correspondence with the pixel electrodes, the common electrode being formed over the pixel electrodes throughout an entire area of the display area; and
    first through fourth non-display areas surrounding the display area,
    wherein the first through fourth non-display areas include a plurality of test pixel areas surrounding the display area,
    wherein each test pixel area includes a test thin film transistor and a test electrode connected to the corresponding test thin film transistor, and
    wherein each test electrode is formed at a same layer as the common electrode, is made of a same material as the common electrode, and is spaced apart from the common electrode.

2. The array substrate of claim 1, wherein the first through fourth non-display areas further include at least one of first and second test gate lines formed parallel to the gate lines, and first and second test data lines formed parallel to the data lines.

3. The array substrate of claim 2, wherein the first and third non-display areas are positioned at opposite sides of the display area and include the first and second test data lines, and
    the first and second test data lines are connected to source electrodes of the plurality of test thin film transistors included in the first and third non-display areas, respectively.

4. The array substrate of claim 3, wherein gate electrodes of the plurality of test thin film transistors included in the first and third non-display areas are respectively connected to the plurality of gate lines included in the display area.

5. The array substrate of claim 2, wherein the second and fourth non-display areas are positioned at opposite sides of the display area, and include the first and second test gate lines, and
    the first and second test gate lines are connected to gate electrodes of the plurality of test thin film transistors included in the second and fourth non-display areas, respectively.

6. The array substrate of claim 5, wherein source electrodes of the plurality of test thin film transistors included in the second and fourth non-display areas are respectively connected to the plurality of data lines included in the display area.

7. The array substrate of claim 1, further comprising:
a plurality of test gate pad electrodes formed in one of the first through fourth non-display areas and connected respectively to one ends of the first and second test gate lines; and
a plurality of test data pad electrodes formed in another of the first through fourth non-display areas and connected respectively to one ends of the first and second test data lines.

8. The array substrate of claim 1, wherein each test pixel area further includes a protection layer formed on a drain electrode of the test thin film transistor included in each test pixel area,
the protection layer having a drain contact hole for exposing said drain electrode of the test thin film transistor.

9. The array substrate of claim 8, wherein the test electrode in each test pixel area contacts the drain electrode of the test thin film transistor included in each test pixel area through the corresponding drain contact hole.

10. The array substrate of claim 1, wherein each of the switching thin film transistors and the test thin film transistors includes a gate electrode, a gate insulating film, semiconductor layers, and a source electrode and a drain electrode spaced apart from each other.

11. The array substrate of claim 10, wherein the pixel electrode included in the pixel area is formed on the gate insulating film, and the drain electrode of the switching thin film transistor extends to an upper surface of one end of the pixel electrode.

12. The array substrate of claim 1, wherein a width of a space between one test pixel area and an adjacent pixel area in a specific direction is equal to or narrower than a width of a space between two adjacent pixel areas in the same specific direction.

13. The array substrate of claim 1, further comprising:
a dummy pixel area formed between each test pixel area and a pixel area located at an edge portion of the display area, the dummy pixel area including the switching thin film transistor and the pixel electrode.

14. The array substrate of claim 1, further comprising:
a gate pad electrode and a data pad electrode formed at one ends of each gate line and each data line, respectively;
a first driving integrated circuit (IC) contacting the gate pad electrodes; and
a second driving IC contacting the data pad electrodes.

15. An array substrate for a fringe field switching mode liquid crystal display, the array substrate comprising:
a display area including a plurality of pixel areas for displaying images, each pixel area including a switch thin film transistor and a plate-shaped pixel electrode connected to the switching thin film transistor,
the display area including a common electrode having a plurality of bar-shaped openings in correspondence with the pixel electrodes, the common electrode being formed over the pixel electrodes throughout an entire area of the display area; and
at least one non-display area surrounding in part the display area,
the at least one non-display area including a row or column of test pixel areas,
each of the test pixel areas including a test thin film transistor and a test electrode connected to the test thin film transistor,
wherein the test electrode is on a same layer as the common electrode, is of a same material as the common electrode, and is spaced apart from the common electrode,
wherein a testing of the test pixel areas is used to detect a defect in the switch thin film transistors.

16. The array substrate of claim 15, wherein the test pixel areas exclude pixel electrodes.

17. The array substrate of claim 15, wherein each test pixel area further includes a protective layer covering the corresponding test thin film transistor and extended to cover the corresponding pixel electrode, the protective layer including a test drain contact hole formed therein, and
the test electrode in each test pixel area is formed over the protective layer and contacts a drain electrode of the corresponding test thin film transistor through the test drain contact hole.

18. The array substrate of claim 15, wherein the at least one non-display area includes first, second, third and fourth non-display areas formed respectively at first, second, third and fourth sides of the display area, and surround the display area, and
each of the first, second, third and fourth non-display areas includes the row or column of test pixel areas.

19. The array substrate of claim 18, wherein the number of the test pixel areas in the row or column of test pixel areas corresponds to the number of data lines or gate lines provided in the display area.

20. A fringe field switching mode liquid crystal display, comprising:
an array substrate including a display area for displaying images;
a color filter substrate including a color filter layer and a black matrix layer; and
a liquid crystal layer between the array substrate and the color filter substrate,
wherein the array substrate includes:
the display area including a plurality of pixel areas for displaying the images, each pixel area including a switch thin film transistor and a plate-shaped pixel electrode connected to the switching thin film transistor,
the display area including a common electrode having a plurality of bar-shaped openings in correspondence with the pixel electrodes, the common electrode being formed over the pixel electrodes throughout an entire area of the display area; and
at least one non-display area surrounding in part the display area,
the at least one non-display area including a row or column of test pixel areas,
each of the test pixel areas including a test thin film transistor and a test electrode connected to the test thin film transistor,
wherein the test electrode is on a same layer as the common electrode, is of a same material as the common electrode, and is spaced apart from the common electrode, and
wherein a testing of the test pixel areas is used to detect a defect in the switch thin film transistors.

* * * * *